(12) United States Patent
Kim

(10) Patent No.: US 7,714,502 B2
(45) Date of Patent: May 11, 2010

(54) FLAT PANEL DISPLAY DEVICE

(75) Inventor: Eun-Ah Kim, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1022 days.

(21) Appl. No.: 11/408,693

(22) Filed: Apr. 21, 2006

(65) Prior Publication Data
US 2006/0244374 A1 Nov. 2, 2006

(30) Foreign Application Priority Data
Apr. 28, 2005 (KR) ........................ 10-2005-0035728

(51) Int. Cl.
*H05B 33/00* (2006.01)
(52) U.S. Cl. ........................ 313/504; 313/506
(58) Field of Classification Search ........................ None
See application file for complete search history.

(56) References Cited

U.S. PATENT DOCUMENTS

| | | | |
|---|---|---|---|
| 7,106,001 B2 | 9/2006 | Kim et al. | |
| 7,301,278 B2 * | 11/2007 | Shiratori et al. | 313/506 |
| 7,446,472 B2 * | 11/2008 | Matsukaze | 313/506 |
| 2004/0212300 A1 * | 10/2004 | Chao et al. | 313/506 |
| 2005/0057149 A1 * | 3/2005 | Herranen et al. | 313/504 |

FOREIGN PATENT DOCUMENTS

| | | |
|---|---|---|
| CN | 1489422 A | 4/2004 |
| EP | 1 391 945 A2 | 2/2004 |
| JP | 8-153586 | 6/1996 |
| JP | 10-012380 | 1/1998 |
| JP | 2000-100560 | 4/2000 |
| JP | 2004-55565 | 2/2004 |
| JP | 2004-327416 | 11/2004 |
| JP | 2005-071693 | 3/2005 |
| JP | 2005-084642 | 3/2005 |
| JP | 2005-347677 | 12/2005 |
| KR | 10-2004-0015507 | 2/2004 |
| KR | 10-2006-0023271 | 3/2006 |
| KR | 10-2006-0023652 | 3/2006 |

OTHER PUBLICATIONS

Patent Abstracts of Japan, Publication No. 10-012380, dated Jan. 16, 1998, in the name of Kenichi Fukuoka.
Patent Abstracts of Japan, Publication No. 2004-327416, dated Nov. 18, 2004, in the name of Ching-Ian Chao et al.
Patent Abstracts of Japan, Publication No. 2005-071693, dated Mar. 17, 2005, in the name of Hideaki Kuwabara.

(Continued)

*Primary Examiner*—Ashok Patel
(74) *Attorney, Agent, or Firm*—Christie, Parker & Hale, LLP

(57) ABSTRACT

A flat panel display device capable of implementing an ultra-slim flat panel display device having an improved aperture ratio by attaching two substrates having independently drivable OLED display elements respectively formed thereon to emit light in the same direction, without a separate sealing process, and preventing image sticking due to a reduction of lifetime of the emission layer, by using the OLED display elements in different uses.

25 Claims, 5 Drawing Sheets

OTHER PUBLICATIONS

Patent Abstracts of Japan, Publication No. 2005-084642, dated Mar. 31, 2005, in the name of Shuichi Seki et al.

Patent Abstracts of Japan, Publication No. 08-153586; Date of Publication: Jun. 11, 1996; in the name of Makoto Takagi et al.

Korean Patent Abstracts, Publication No. 1020060023271 A; Date of Publication: Mar. 14, 2006; in the name of Young Wook Ko, et al.

Korean Patent Abstracts, Publication No. 1020060023652 A; Date of Publication: Mar. 15, 2006; in the name of Young Wook Ko, et al.

China Office action dated Jul. 11, 2008, for corresponding China application 2006100748785, with English translation indicating relevance of China publication listed in this IDS.

Patent Abstracts of Japan, for Publication No. 2000-100560; Dated Apr. 7, 2000 in the name of Yuji Kudo et al.

Patent Abstracts of Japan, for Publication No. 2004-055565; Dated Feb. 19, 2004 in the name of Hyung Wook Kim et al.

* cited by examiner

FLAT PANEL DISPLAY DEVICE

CROSS-REFERENCE TO RELATED APPLICATION

This application claims priority to and the benefit of Korean Patent Application No. 10-2005-0035728, filed Apr. 28, 2005, which is incorporated herein by reference in its entirety.

BACKGROUND

1. Field of the Invention

The present invention relates to a flat panel display device capable of improving resolution and aperture ratio by attaching first and second substrates to each other, which include organic light emitting diodes (OLEDs), respectively, and more particularly, to an active matrix OLED display device capable of increasing an aperture ratio of an emission region by forming a thin film transistor (TFT) used in an active matrix flat panel display device in a layered structure.

2. Description of the Related Art

While a cathode ray tube (CRT), a conventional display device, has been widely used as a monitor in TVs, measuring instruments, information terminals, and similar devices, it is difficult to adapt the CRT for use in a small-sized and light-weight electronic devices, due to its weight and size.

As a substitute for the CRT, a flat panel display device is attracting public attention, which can readily be made small in size and light-weight. Flat panel display devices include liquid crystal displays (LCDs), OLED displays and similar devices.

Flat panel display devices (FPD) are classified into passive matrix FPDs and active matrix FPDs based on a driving mechanism.

FIGS. 1A and 1B are cross-sectional views of a conventional top emission OLED display device.

First, a buffer layer having a predetermined thickness (not shown) is formed on a first substrate 100 having red, green, and blue pixel regions. The buffer layer is formed to prevent impurities from leaking from the first substrate 100 into a TFT to be formed through the following process.

Next, a polysilicon layer pattern (not shown) is formed on the buffer layer, and impurities are implanted into both sides of the polysilicon layer pattern to form source and drain regions. At this time, a channel region is formed between the source and drain regions.

Next, a gate insulating layer (not shown) is formed on the entire surface of the resultant structure, and a gate electrode is formed to correspond to the channel region of the polysilicon layer pattern.

Next, an interlayer insulating layer (not shown) is formed on the entire surface of the resulting structure and then etched to form a contact hole (not shown) for exposing the source and drain regions. Source and drain electrodes (not shown) are formed to be connected to the source and drain regions through the contact hole.

Then, a passivation layer (not shown) and a planarization layer (not shown) are formed on the entire surface of the resultant structure.

Next, the passivation layer and the planarization layer are etched to form a via-hole for exposing the drain electrode.

A pixel electrode (not shown) connected to the drain electrode through the via-hole is formed. The pixel electrode may be a reflective electrode.

Next, a portion of the pixel electrode is exposed to form a pixel defining layer pattern for defining an emission region, Then, an organic layer (not shown) including at least an emission layer and an opposite electrode are formed on the entire surface of the resultant structure.

Next, a transparent passivation layer (not shown) is formed on the opposite electrode.

A second substrate 200 is correspondingly attached and sealed to the first substrate 100.

FIG. 2 is a photograph illustrating a pixel region of an OLED display formed through the method, region A represents an emission region, and region B represents a non-emission region.

As described above, the conventional OLED display is an active matrix OLED display, and a pixel region includes an emission region A and a non-emission region B. Each pixel includes a switching TFT, a driving TFT, a capacitor, and a light emitting diode. As a result, each pixel of the OLED display includes two TFTs and one capacitor. It is difficult to reduce the size of the TFTs and the capacitor, because the device is integrated, as a result, a decrease of the emission region leads to a reduction in an aperture ratio.

SUMMARY

The present invention, therefore, provides a flat panel display device capable of reducing a thickness thereof by respectively forming organic light emitting diodes on first and second substrates attached to each other.

The flat panel display provides an increased aperture ratio by using emitting first and second substrates that are attached to each other in the same direction, which also increases the lifespan of the device.

In one embodiment, the flat panel display device may include: a first OLED display element having a first pixel electrode disposed on a first substrate, a first opposite electrode, a first organic layer including at least an emission layer; and a second OLED display element correspondingly attached to a second substrate, the second OLED having a second pixel electrode disposed on the second substrate, a second opposite electrode, and a second organic layer including at least an emission layer.

The flat panel display device may be a dual emission OLED display.

The first and second OLEDs may emit light in the same direction.

In another embodiment, the flat panel display device may include: a first pixel electrode disposed on a first substrate; a first organic layer including at least an emission layer disposed on the first pixel electrode; a first OLED display element having a first opposite electrode disposed on the first organic layer; a second opposite electrode spaced apart from the first opposite electrode of the first OLED display element; a second organic layer including at least an emission layer disposed on the second opposite electrode; a second pixel electrode disposed on the second organic layer; and a second OLED display element including the second pixel electrode, and having a second substrate attached to the first substrate using an adhesive agent.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION

Figure 1A:
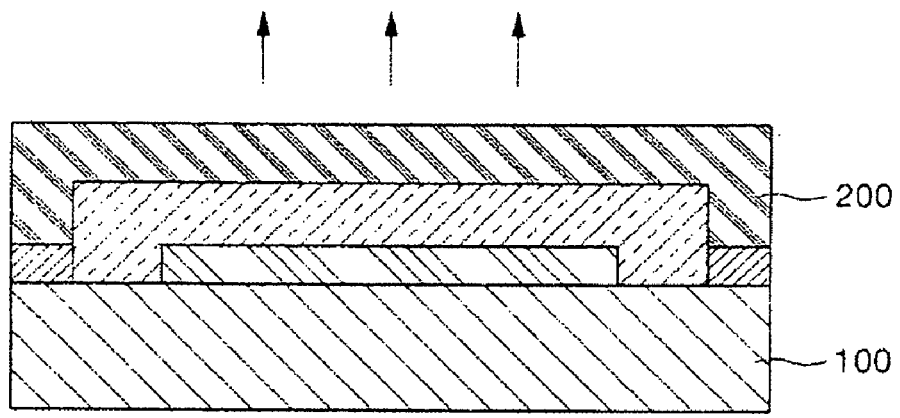
FIGS. 1A and 1B are schematic cross-sectional views illustrating a conventional OLED display.
Figure 1B:
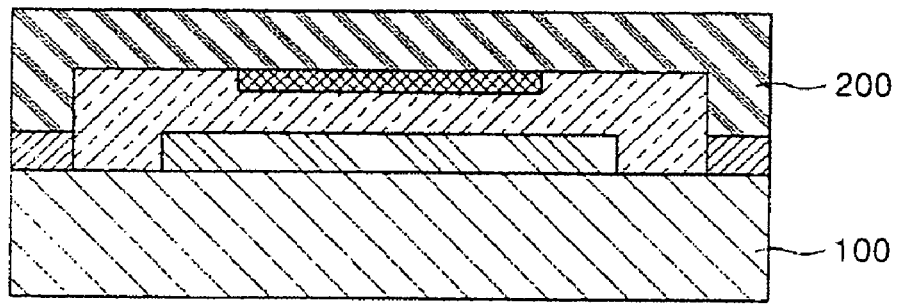
Figure 2:
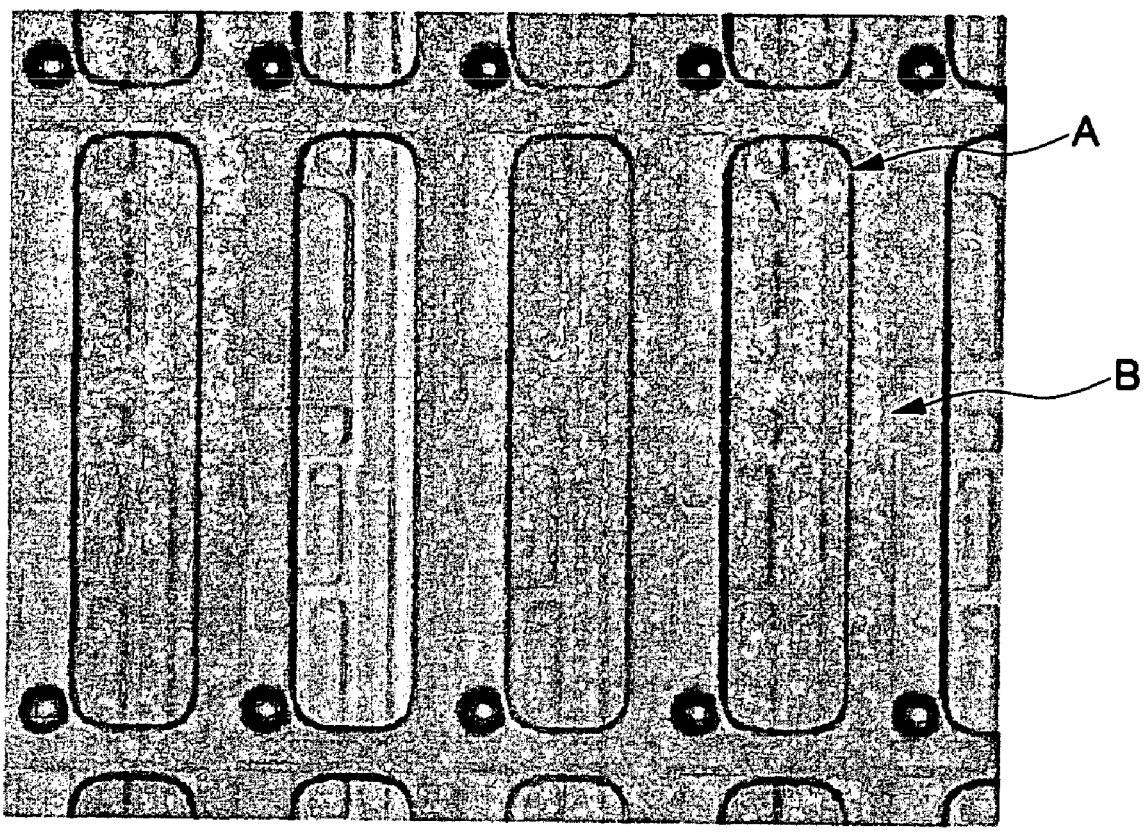
FIG. 2 is a photograph of a pixel region of a conventional OLED display.
Figure 3:
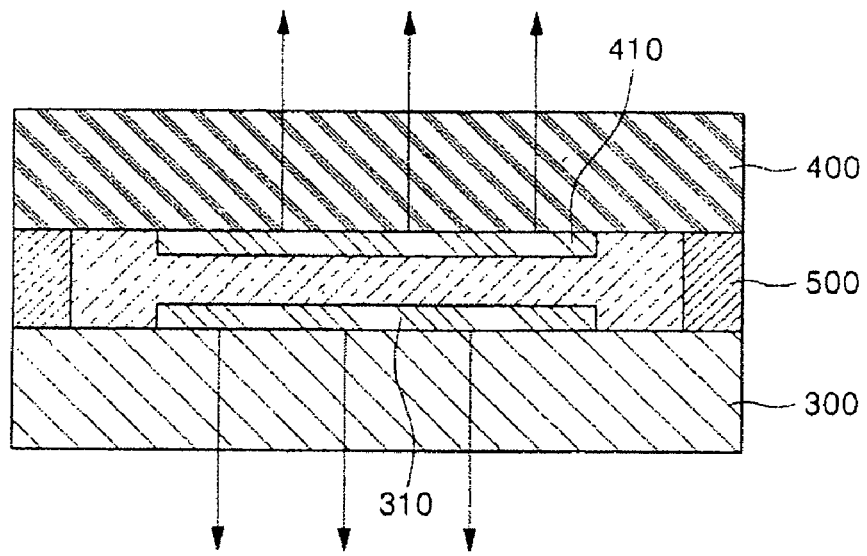
FIG. 3 is a schematic cross-sectional view of an OLED display.

FIG. 3 is a schematic cross-sectional view illustrating one embodiment of an OLED display.

Referring to FIG. 3, disposed on a first substrate 300 is a first organic light emitting diode (OLED) display element 310 having a first pixel electrode (not shown), a first opposite electrode (not shown), and a first organic layer (not shown) including at least an emission layer. Disposed on a second substrate 400 is a second OLED display element 410 having a second pixel electrode (not shown), a second opposite electrode (not shown), and a second organic layer including at least an emission layer. First and second substrates, which include the first and second OLED display elements, respectively, are attached by an adhesive agent 500. Passivation layers (not shown) may be additionally disposed on the first and second opposite electrodes.

The first and second OLED display elements can be independently driven, if necessary, the first and second OLED display elements may be individually driven or simultaneously driven.

The first and second OLED display elements may be driven as an active matrix OLED display or a passive matrix OLED display. The first and second OLEDs display elements may include top emission OLEDs.

Figure 4:
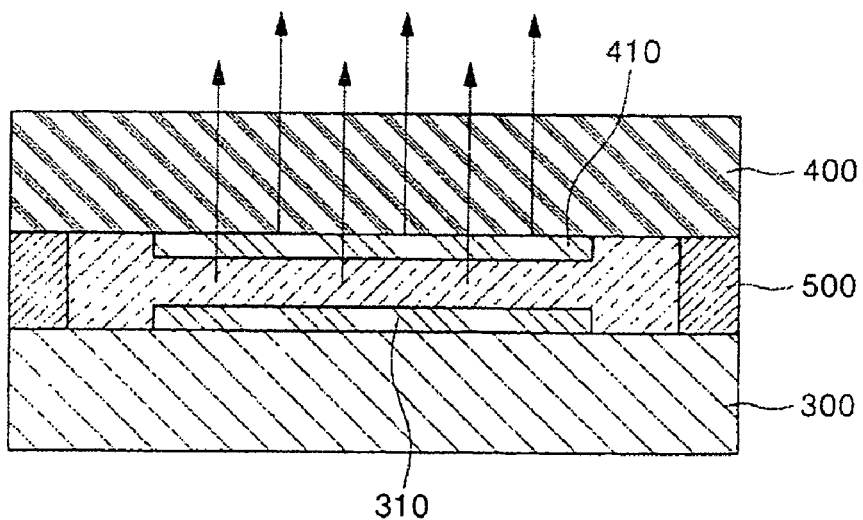
FIG. 4 is a cross-sectional view of an OLED display.

FIG. 4 is a cross-sectional view of an OLED display in accordance with another embodiment, which is configured in the same structure as that of FIG. 3, except that the OLED display of FIG. 4 includes single emission OLEDs, while the OLED display of FIG. 3 includes dual emission OLEDs.

Referring to FIG. 4, in one embodiment, the first OLED display element and the second OLED display element may be driven as an active matrix OLED display. The first OLED in the first OLED display element may be a top emission OLED, and the second OLED in the second OLED display element may be a dual emission OLED.

In another embodiment, the first OLED display element may be driven as an active matrix OLED display, and the second OLED display element may be driven as a passive matrix OLED display. The first OLED may be a top emission OLED, and the second OLED may be a dual emission OLED or a bottom emission OLED.

In a further embodiment, the first OLED display element may be driven as a passive matrix OLED display, and the second OLED display element may be driven as an active matrix OLED display. The first OLED may be a top emission OLED, and the second OLED may be a dual emission OLED.

In a further embodiment, the first OLED display element and the second OLED display element may be driven as a passive matrix OLED display. The first OLED may be a top emission OLED, and the second OLED may be a dual emission OLED or a bottom emission OLED.

The second OLED display element has an emission region aligned with a non-emission region of the first OLED display element, and the emission regions of the first and second OLED display elements are arranged not to overlap each other. In another embodiment, the emission region of the second OLED display element may be aligned to overlap with at least a portion of the non-emission region of the first OLED display element. The pixel electrode and the opposite electrode of the OLED display element located on the emission surface are formed of a transparent electrode.

The first and second OLED display elements may be individually driven to be used separately, for example, when the first OLED display element is used for moving pictures, the second OLED display element may be used to display characters, and so on. The OLED display element used for the moving pictures uses full colors, and the OLED display element used for the characters uses super yellow or red having a relatively longer lifetime to delay image sticking. The OLED display element used for the moving pictures may use full colors, and the OLED display element used for the characters may use complementary colors such as cyan, magenta, and yellow, to display various colors.

Figure 5:
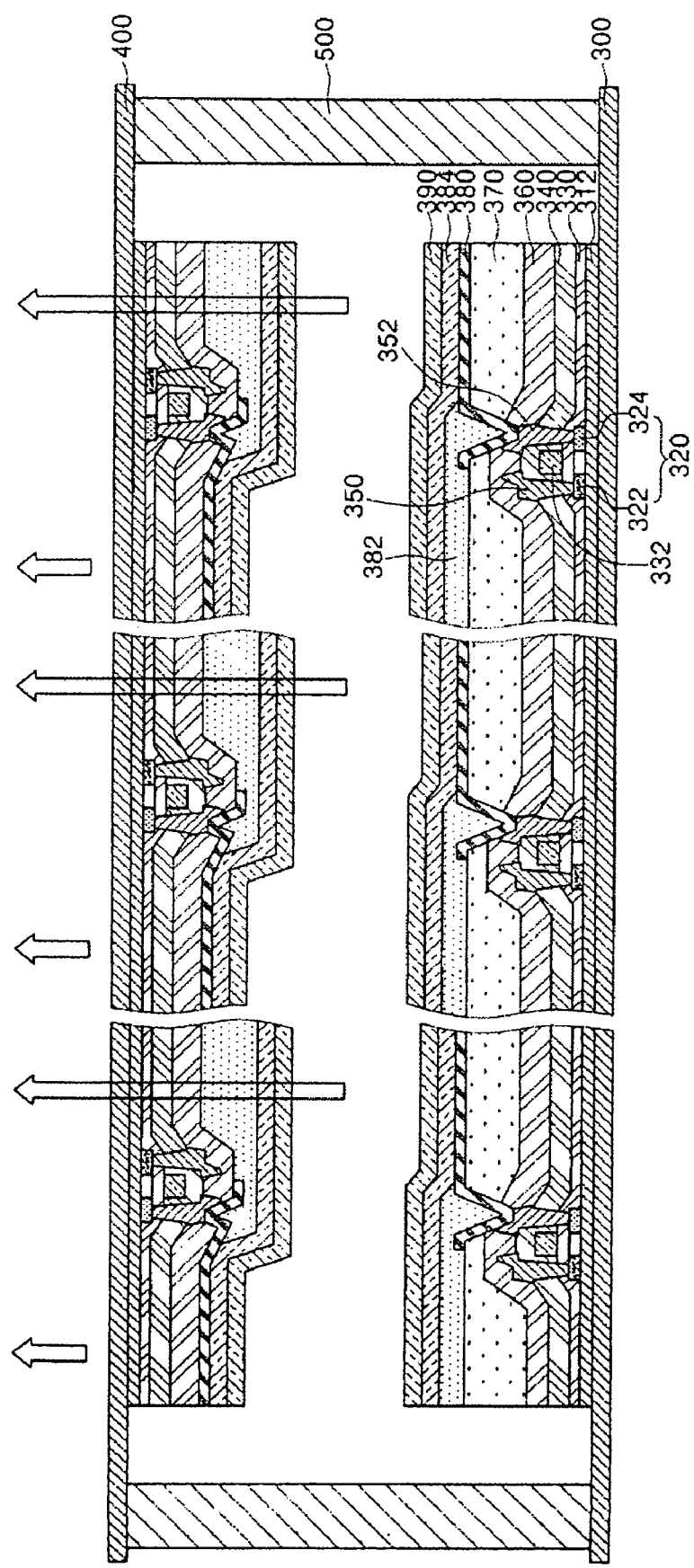
FIG. 5 is a cross-sectional view specifically illustrating the OLED display of FIG. 4.

FIG. 5 is a cross-sectional view specifically illustrating the OLED display of FIG. 4, a fabricating method of which will be described in conjunction with FIG. 5. FIG. 5 illustrates when the first and second OLED display elements are driven as an active matrix OLED display, the first OLED is a top emission OLED, and the second OLED is a bottom emission OLED.

A buffer layer 312 is formed on a first substrate 300. The buffer layer 312 is formed of a silicon oxide layer, a silicon nitride layer, or a stacked layer of the silicon oxide layer and the silicon nitride layer in order to prevent impurities leaked from the substrate 300 from being introduced into a TFT formed through the following process.

Next, a polysilicon layer pattern 320 is formed on the buffer layer 312.

Then, after forming a gate insulating layer 330 on the entire surface of the resultant structure, a gate electrode 332 is formed on the polysilicon layer pattern 320.

Next, impurities are implanted into the polysilicon layer pattern 320 on both sides of the gate electrode 332 to form source and drain regions 322 and 324.

An interlayer insulating layer 340 is formed on the entire surface of the resultant structure, and then etched to form a contact hole (not shown) for exposing the source and drain regions 322 and 324. Source and drain electrodes 350 and 352 are formed to connect to the source and drain regions 322 and 324 through the contact hole.

Then, a passivation layer 360 and a planarization layer 370 are formed on the entire surface of the resultant structure.

Next, the passivation layer 360 and the planarization layer 370 are etched to form a via-hole (not shown) for exposing the drain electrode 352.

Pixel electrodes 380 connected to the drain electrode 352 through the via-hole are formed. The pixel electrode 380 may be a reflective electrode made of a stacked layer of a metal material having a high reflectivity and a transparent electrode.

Next, a portion of the pixel electrode 380 is exposed to form a pixel defining layer pattern 382 for defining an emission region.

Then, an opposite electrode 390 and an organic layer 384 including at least an emission layer are formed on the entire surface of the resultant structure to form a first OLED display element.

Next, a second OLED display element is formed on a second substrate 400 through the abovementioned method. The process of forming the planarization layer 370 after forming the passivation layer 360 is omitted. In addition, the pixel electrode 380 may be formed of a transparent electrode, and the opposite electrode 390 is formed of a reflective electrode.

Next, the first and second substrates are aligned to each other to be attached to each other using an adhesive agent 500. The emission regions of the first and second OLED display elements may not overlap each other.

Figure 6:
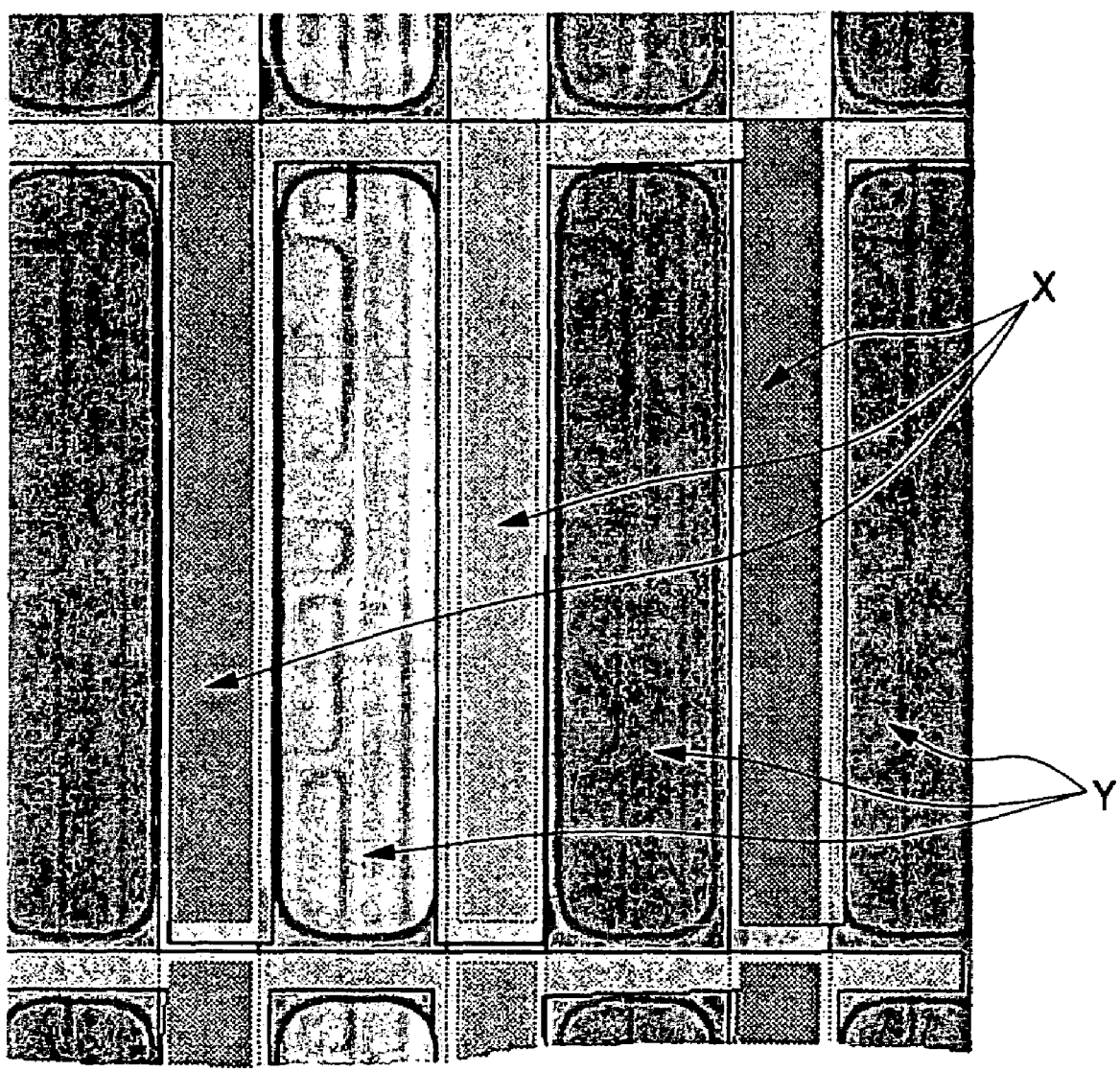
FIG. 6 is a plan view of a pixel region of an OLED display.

FIG. 6 is a plan view illustrating a pixel region of an OLED display in accordance with the present invention, representing emission regions X of the active matrix OLED display, and emission regions Y of the passive matrix OLED display formed at the non-emission region of the active matrix OLED display. As described above, the two substrates with OLED display elements are attached to each other to emit light in the same direction to improve an aperture ratio of the flat panel display device by more than 70%.

As can be seen from the foregoing, the embodiments provide an apparatus and method of implementing an ultra-slim flat panel display device having an improved aperture ratio by attaching two substrates having OLEDs respectively formed thereon, without an individual sealing process, and preventing image sticking due to a reduction of the lifetime of the emission layer by using the OLED display elements for different purposes.

While the invention has been described in connection with certain exemplary embodiments it is to be understood by those skilled in the art that the invention is not limited to the disclosed embodiments, but, on the contrary, is intended to cover various modifications included within the spirit and scope of the appended claims and equivalents thereof.

What is claimed is:

1. A flat panel display device comprising:
   a first organic light emitting diode (OLED) display element on a first substrate having a first pixel electrode, a first opposite electrode, and a first organic layer including at least an emission layer; and
   a second OLED display element on a second substrate, the second substrate coupled to the first substrate, the second OLED display element having a second pixel electrode, a second opposite electrode, and a second organic layer including at least an emission layer;
   wherein the second OLED display element has an emission region aligned with a non-emission region of the first OLED display element, and
   wherein the first OLED display element and second OLED display element emit light in the same direction.

2. The flat panel display device according to claim 1, further comprising passivation layers formed on the first opposite electrode and second opposite electrode.

3. The flat panel display device according to claim 1, wherein the first OLED display element and second OLED display element are independently driven.

4. The flat panel display device according to claim 1, wherein the first OLED display element and second OLED display element are driven as an active matrix OLED display.

5. The flat panel display device according to claim 4, wherein the first OLED display element includes a top emission OLED and the second OLED display element includes a dual emission OLED.

6. The flat panel display device according to claim 1, wherein the first OLED display element is driven as an active matrix OLED display and the second OLED display element is driven as a passive matrix OLED display.

7. The flat panel display device according to claim 6, wherein the first OLED display element includes a top emission OLED and the second OLED display element includes one of a dual emission OLED and a bottom emission OLED.

8. The flat panel display device according to claim 1, wherein the first OLED display element is driven as a passive matrix OLED display and the second OLED display element is driven as an active matrix OLED display.

9. The flat panel display device according to claim 8, wherein the first OLED display element includes a top emission OLED and the second OLED display element includes a dual emission OLED.

10. The flat panel display device according to claim 1, wherein the first OLED display element and second OLED display element are driven as a passive matrix OLED display.

11. The flat panel display device according to claim 10, wherein the first OLED display element includes a top emission OLED and the second OLED display element includes one of a dual emission OLED and a bottom emission OLED.

12. The flat panel display device according to claim 1, wherein at least one of the first OLED display element and second OLED display element is made of a full color OLED.

13. The flat panel display device according to claim 1, wherein the emission region of the second OLED display element overlaps at least a portion of the non-emission region of the first OLED display element.

14. The flat panel display device according to claim 1, wherein the first OLED display element and second OLED display element have emission regions not overlapping each other.

15. A flat panel display device comprising:
   a first organic light emitting diode (OLED) display element including a first pixel electrode disposed on a first substrate, a first organic layer including at least an emission layer disposed on the first pixel electrode and a first opposite electrode disposed on the first organic layer; and
   a second OLED display element including a second opposite electrode spaced apart from the first opposite electrode of the first OLED display element, a second organic layer including at least an emission layer disposed on the second opposite electrode, and a second pixel electrode disposed on the second organic layer, the second pixel electrode disposed on a second substrate,
   wherein the second substrate is coupled to the first substrate using an adhesive agent;
   wherein the second OLED display element has an emission region aligned with a non-emission region of the first OLED display element, and
   wherein the first OLED display element and second OLED display element emit light in the same direction.

16. The flat panel display device according to claim 15, wherein the first OLED display element and second OLED display element are independently driven.

17. The flat panel display device according to claim 15, further comprising passivation layers formed on the first opposite electrode and second opposite electrode.

18. The flat panel display device according to claim 15, wherein at least one of the first OLED display element and second OLED display element is made of a full color OLED.

19. The flat panel display device according to claim 15, wherein the first OLED display element and second OLED display element are driven as an active matrix OLED display.

20. The flat panel display device according to claim 15, wherein the first OLED display element includes a top emission OLED, and the second OLED display element includes a dual emission OLED.

21. The flat panel display device according to claim 15, wherein the first OLED display element and second OLED display element have emission regions not overlapping each other.

22. The flat panel display device according to claim 15, wherein the first OLED display element is driven as an active matrix OLED display and the second OLED display element is driven as a passive matrix OLED display.

23. The flat panel display device according to claim 15, wherein the first OLED display element is driven as a passive matrix OLED display and the second OLED display element is driven as an active matrix OLED display.

24. The flat panel display device according to claim 15, wherein the first OLED display element and second OLED display element are driven as a passive matrix OLED display.

25. The flat panel display device according to claim 15, wherein the emission region of the second OLED display element is aligned with at least a portion of the non-emission region of the first OLED display element.

* * * * *